(12) United States Patent
Kanda

(10) Patent No.: US 12,211,819 B2
(45) Date of Patent: Jan. 28, 2025

(54) METHOD OF MANUFACTURING SEMICONDUCTOR DEVICE AND SEMICONDUCTOR DEVICE

(71) Applicant: SONY SEMICONDUCTOR SOLUTIONS CORPORATION, Kanagawa (JP)

(72) Inventor: Eiichiro Kanda, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/346,375

(22) Filed: Jul. 3, 2023

(65) Prior Publication Data

US 2023/0352440 A1 Nov. 2, 2023

Related U.S. Application Data

(63) Continuation of application No. 17/577,483, filed on Jan. 18, 2022, now Pat. No. 11,721,664, which is a
(Continued)

(30) Foreign Application Priority Data

May 16, 2017 (JP) ................................. 2017-096922

(51) Int. Cl.
*H01L 23/00* (2006.01)
*H01L 25/065* (2023.01)
*H01L 25/00* (2006.01)

(52) U.S. Cl.
CPC .............. *H01L 24/80* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS 9,064,397 B2 * 6/2015 Kawano ................. G08B 21/06
9,679,867 B2    6/2017 Ashidate et al.
(Continued)

FOREIGN PATENT DOCUMENTS

CN    102971851 A    3/2013
CN    104576637 A    4/2015
(Continued)

OTHER PUBLICATIONS

International Search Report and Written Opinion of PCT Application No. PCT/JP2018/017402, issued on Jul. 17, 2018, 08 pages of English Translation and 08 pages of ISRWO.
(Continued)

*Primary Examiner* — Michelle Mandala
(74) *Attorney, Agent, or Firm* — CHIP LAW GROUP

(57) ABSTRACT

Electrical connection between electrodes provided respectively at facing positions in joint surfaces of substrates to be joined by chip lamination technology is conducted more securely. A method of manufacturing a semiconductor device includes: a first step of embedding electrodes in insulating layers exposed to the joint surfaces of a first substrate and a second substrate; a second step of subjecting the joint surfaces of the first substrate and the second substrate to chemical mechanical polishing, to form the electrodes into recesses recessed as compared to the insulating layers; a third step of laminating insulating films of a uniform thickness over the entire joint surfaces; a fourth step of forming an opening by etching in at least part of the insulating films covering the electrodes of the first substrate and the second substrate; a fifth step of causing the corresponding electrodes to face each other and joining the joint
(Continued)

surfaces of the first substrate and the second substrate to each other; and a sixth step of heating the first substrate and the second substrate joined to each other, causing the electrode material to expand and project through the openings, and joining the corresponding electrodes to each other.

11 Claims, 9 Drawing Sheets

Related U.S. Application Data continuation of application No. 16/611,554, filed as application No. PCT/JP2018/017402 on May 1, 2018, now Pat. No. 11,257,782.

(52) U.S. Cl.
CPC .......... *H01L 25/0657* (2013.01); *H01L 25/50* (2013.01); *H01L 2224/80031* (2013.01); *H01L 2224/80345* (2013.01); *H01L 2224/80895* (2013.01); *H01L 2924/37001* (2013.01)

(56) References Cited

U.S. PATENT DOCUMENTS

| | | |
|---|---|---|
| 9,911,870 B2 | 3/2018 | Sato |
| 2013/0105663 A1 | 5/2013 | Endo et al. |
| 2013/0112849 A1 | 5/2013 | Shimotsusa |
| 2014/0252527 A1 | 9/2014 | Sato |
| 2014/0353828 A1 | 12/2014 | Edelstein et al. |
| 2015/0108644 A1 | 4/2015 | Kuang et al. |
| 2015/0262976 A1 | 9/2015 | Edelstein et al. |

FOREIGN PATENT DOCUMENTS

| | | |
|---|---|---|
| EP | 2591505 A1 | 5/2013 |
| JP | 2011-049270 A | 3/2011 |
| JP | 2012-019147 A | 1/2012 |
| JP | 2012-019148 A | 1/2012 |
| RU | 2521224 C1 | 6/2014 |
| WO | 2012/004964 A1 | 1/2012 |
| WO | 2012/004965 A1 | 1/2012 |

OTHER PUBLICATIONS

International Preliminary Report on Patentability of PCT Application No. PCT/JP2018/017402, issued on Nov. 28, 2019, 08 pages of English Translation and 05 pages of IPRP.
Notice of Allowance for U.S. Appl. No. 16/611,554, issued on Oct. 15, 2021, 9 pages.
Non-Final Office Action for U.S. Appl. No. 16/611,554, issued on May 10, 2021, 9 pages.
Notice of Allowance for U.S. Appl. No. 17/577,483 issued on Mar. 27, 2023, 7 pages.
Non-Final Office Action for U.S. Appl. No. 17/577,483, issued on Dec. 14, 2022, 9 pages.

* cited by examiner

METHOD OF MANUFACTURING SEMICONDUCTOR DEVICE AND SEMICONDUCTOR DEVICE

CROSS REFERENCE TO RELATED APPLICATIONS

This application is a continuation application of U.S. patent application Ser. No. 17/577,483, filed on Jan. 18, 2022, which is a continuation application of U.S. patent application Ser. No. 16/611,554, filed on Nov. 7, 2019 (now U.S. Pat. No. 11,257,782), which is U.S. National Phase of International Patent Application No. PCT/JP2018/017402 filed on May 1, 2018, which claims priority benefit of Japanese Patent Application No. JP 2017-096922 filed in the Japan Patent Office on May 16, 2017. Each of the above-referenced applications is hereby incorporated herein by reference in its entirety.

TECHNICAL FIELD

The present technology relates to a method of manufacturing a semiconductor device and a semiconductor device.

BACKGROUND ART

There are chip lamination techniques such as chip-on-chip, chip-on-wafer and wafer-on-wafer, in which substrates formed with semiconductor elements or integrated circuits are joined to each other to achieve three-dimensional lamination. Use of the chip lamination technique reduces the area occupied by a semiconductor device. In addition, the number of chips which can be produced from a single sheet of semiconductor wafer is increased, contributing to improved yield.

On joint surfaces of the substrates to be laminated together by the chip lamination technique, electrodes which can be electrically connected are disposed at positions where the joint surfaces face each other. The substrates to be laminated together are subjected, before bonding, to polishing or grinding of the joint surfaces by chemical mechanical polishing technique to planarize the joint surfaces.

Here, the chemical mechanical polishing technique involves polishing selection ratio, and, depending on the selection of abrasive and a polishing cloth to be used, it is possible that a difference in polishing rate occurs between the structures constituting the joint surfaces. Specifically, if an electrode section is higher in polishing rate than the surrounding structure, the electrode section is formed into a recessed shape, whereas if the electrode section is lower in polishing rate than the surrounding structure, the electrode section is formed into a projected shape.

In the case where the electrode section is formed into a recessed shape, it is possible for the electrical connection between the electrodes exposed to the joint surfaces to become insufficient. On the other hand, in the case where the electrode section is formed into a projected shape, it is possible for the metallic material of the projecting electrodes to be crushed and extended at the time of joining, leading to formation of unintended electrical connection with the adjacent electrodes.

PTL 1 proposes a method in which, for solving the problem in the case where the electrode section is formed into a recessed shape, films of polysilicon are formed on the joint surfaces of the substrates by chemical vapor deposition, these polysilicon films are planarized by chemical mechanical polishing technique, thereafter the substrates are joined to each other and heat treated to silicidize the polysilicon between the electrodes, thereby achieving electrical connection.

In addition, PTL 1 proposes a method in which, for solving the problem in the case where the electrode section is formed into a projected shape, silicon nitride films are formed on the joint surfaces of the substrates, the surfaces of the silicon nitride films are planarized by chemical mechanical polishing technique, thereafter silicon carbonitride films are formed, an opening is formed in the electrode section by etching, and copper as the material of the electrode sections is thermally expanded by heat treatment to be joined to each other, thereby achieving electrical connection between the facing electrodes.

CITATION LIST

Patent Literature

[PTL 1]
Japanese Patent Laid-open No. 201 6-1 7401 6

SUMMARY

Technical Problem

However, in the countermeasure taken against the case where the electrode section has a projected shape as described in PTL 1, there is a possibility that, at the time of chemical mechanical polishing of the polysilicon laminated on the electrode section having the projected shape, the whole area of the joint surface cannot be planarized, and a recess (dishing) would be generated, making the electrical connection defective (open). In addition, in the countermeasure taken against the case where the electrode section has a recessed shape as described in PTL 1, there is a problem that the silicon nitride laminated on the electrode section having the recessed shape is difficult to be processed by the chemical mechanical polishing technique.

The present technology has been made in consideration of the above-mentioned circumstances. It is an object of the present technology to perform electrical connection more securely between electrodes provided at facing positions in joint surfaces of substrates to be joined to each other by chip lamination technique.

Solution to Problem

According to one mode of the present technology, there is provided a method of manufacturing a semiconductor device, the method including: a first step of embedding electrodes in insulating layers exposed to joint surfaces of a first substrate and a second substrate; a second step of subjecting the joint surfaces of the first substrate and the second substrate to chemical mechanical polishing, to form the electrodes into recesses recessed as compared to the insulating layers; a third step of laminating insulating films of a uniform thickness over the entire joint surfaces; a fourth step of forming an opening by etching in at least part of the insulating films covering the electrodes of the first substrate and the second substrate; a fifth step of causing the corresponding electrodes to face each other and joining the joint surfaces of the first substrate and the second substrate to each other; and a sixth step of heating the first substrate and the second substrate joined to each other, causing the electrode material to expand and project through the opening, and joining the corresponding electrodes to each other.

In addition, according to one mode of the present technology, there is provided a method of manufacturing a semiconductor device, the method including: a seventh step of embedding electrodes in insulating layers exposed to joint surfaces of a first substrate and a second substrate; an eighth step of subjecting the joint surfaces of the first substrate and the second substrate to chemical mechanical polishing to form the electrodes into projections projecting from the insulating layers; a ninth step of laminating on the joint surface an insulating film in substantially the same thickness as the projection; a tenth step of completely removing by etching the insulating films covering the electrodes; and an eleventh step of causing the corresponding electrodes to face each other and joining the joint surfaces of the first substrate and the second substrate to each other.

Besides, according to one mode of the present technology, there is provided a semiconductor device including: a first substrate; a second substrate to be joined to the first substrate; electrodes embedded at facing positions in joint surfaces of the first substrate and the second substrate, with an electrode surface of at least one of the first substrate and the second substrate being formed in a recess recessed as compared to a surrounding insulating layer; and insulating films laminated in a uniform thickness along the joint surfaces of the first substrate and the second substrate, and having openings in at least part of portions covering the electrodes, and in which an electrode material swelling via at least one of the openings is joined to an electrode material on the other side.

The above-described methods of manufacturing a semiconductor device include various modes, such as a mode in which the method is carried out as part of other method, or a mode in which the method is realized as a method of manufacturing a semiconductor device including means corresponding to the steps. In addition, the above-described semiconductor device includes various modes such as a mode in which the semiconductor device is worked in the state of being incorporated in other apparatus, or a mode in which the semiconductor device is worked together with other method.

Advantageous Effects of Invention

According to the present technology, it is possible to perform electrical connection more securely between electrodes provided respectively at facing positions in joint surfaces of substrates to be laminated together by chip lamination technique. Note that the effects described herein are merely illustrative and not limitative, and additional effects may be present.

DESCRIPTION OF EMBODIMENTS

Figure 1:
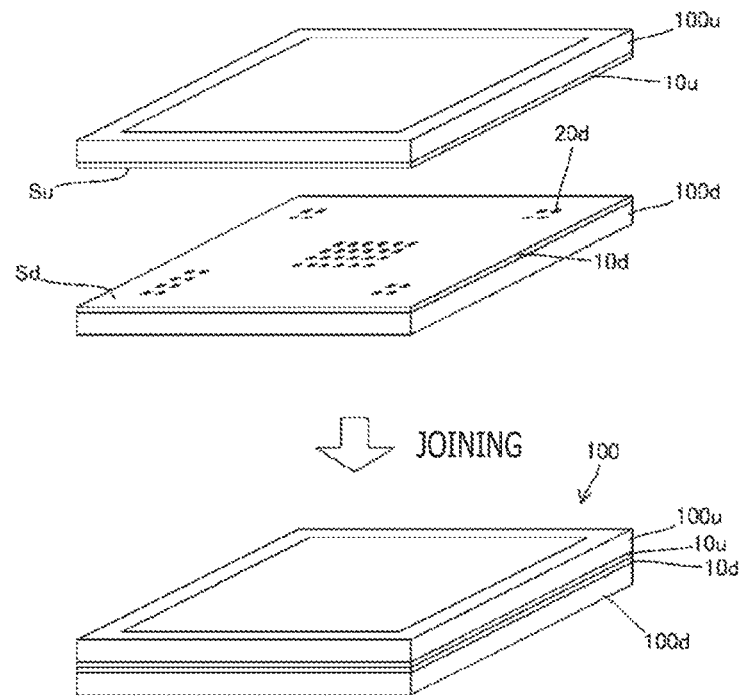
FIG. 1 is a figure perspectively depicting a general structure of a semiconductor device.
Figure 2:
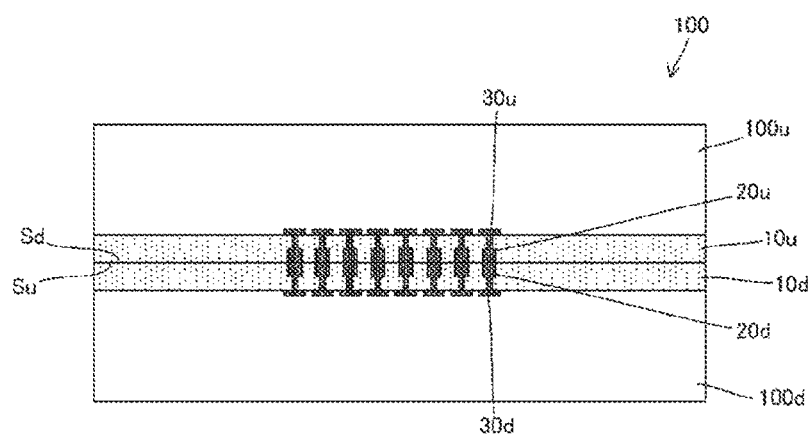
FIG. 2 is a figure sectionally depicting a general structure of the semiconductor device.

The present technology will be described below in the following order.
(A) First Embodiment
(B) Second Embodiment
(C) Third Embodiment
(D) Fourth Embodiment
(E) Fifth Embodiment
(F) Sixth Embodiment (A) First Embodiment FIG. 1 is a figure perspectively depicting a general structure of a semiconductor device 100 according to the present embodiment, and FIG. 2 is a figure sectionally depicting the general structure of the semiconductor device 100 according to the present embodiment.

The semiconductor device 100 has a configuration in which a joint surface Su of a first substrate 100u and a joint surface Sd of a second substrate 100d are joined to each other by bonding. Electrodes 20u are embedded in the joint surface Su of the first substrate 100u, and electrodes 20d are embedded in the joint surface Sd of the second substrate 100d. In the semiconductor device 100, the electrodes 20u of the first substrate 100u and the electrodes 20d of the second substrate 100d that correspond to each other are located to face each other.

The electrodes 20u of the first substrate 100u penetrate in the thickness direction an insulating layer 10u formed along the joint surface Su, and are connected to a wiring 30u provided on the opposite side of the insulating layer 10u. Similarly, the electrodes 20d of the second substrate 100d penetrate in the thickness direction an insulating layer 10d formed along the joint surface Sd, and are connected to a wiring 30d provided on the opposite side of the insulating layer 10d. In a state in which the electrodes 20u of the first substrate 100u and the electrodes 20d of the second substrate 100d are joined to each other, the wiring 30u of the first substrate 100u and the wiring 30d of the second substrate 100d are electrically connected with each other. Naturally, the electrodes 20u and 20d can be dummy electrodes which are not connected to the wirings.

Figure 3:
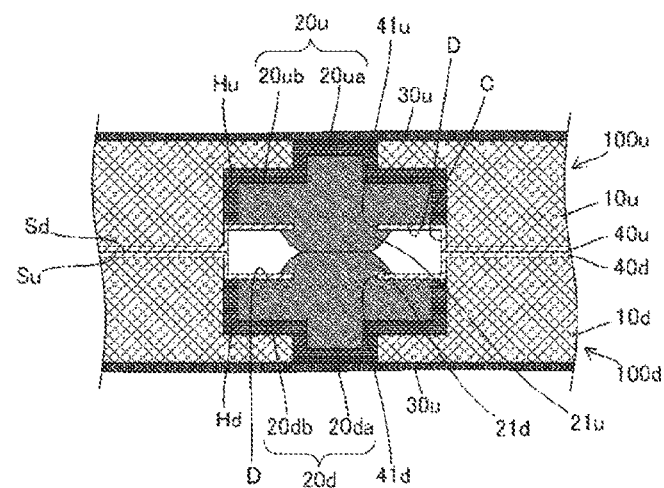
FIG. 3 is a figure sectionally depicting an electrode joint section of a semiconductor device according to a first embodiment.

FIG. 3 is a figure sectionally depicting, in an enlarged form, an electrode joint section of the semiconductor device 100 according to the present embodiment.

The electrode 20u includes a barrier metal film 20ua formed such as to cover the inside of a through-hole Hu penetrating the insulating layer 10u in the thickness direction, and a conductive section 20ub formed by forming a film of an electrode material on the inside of the barrier metal film 20ua or filling the inside with the electrode material. Similarly, the electrode 20d includes a barrier metal film 20da formed in a film shape such as to cover the inside of a through-hole Hd penetrating the insulating layer 10d in the thickness direction, and a conductive section 20db formed by forming a film of an electrode material on the inside of the barrier metal film 20da or filling the inside with the electrode material.

On the joint surface Su side of the first substrate 100u, the insulating layer 10u has a substantially flat surface, the electrode 20u is one step recessed as compared to the insulating layer 10u constituting the surrounding structure, and a recess D is provided in the part of the electrode 20u. The joint surface Su of the first substrate 100u is covered with an insulating film 40u laminated in a thin film form in a substantially uniform thickness along the joint surface Su, and the insulating film 40u is formed integrally inclusive of its portion covering a recessed shape of the electrode 20u. In other words, the insulating film 40u on the joint surface Su side also has a recessed shape at the part of the electrode 20u.

The insulating film 40u has an opening 41u in at least part of its portion covering the electrode 20u. As illustrated in FIGS. 5A, 5B, 5C, 5D, 5E, and 5F, the opening 41u may be formed in a partial area of the insulating film 40u covering the electrode 20u, may be formed dispersedly in a plurality of locations of the insulating film 40u covering the electrode 20u, or may be formed in substantially the whole area of the insulating film 40u covering the electrode 20u. FIGS. 5A, 5B, 5C, 5D, 5E, and 5F are figures for explaining variations of the shape of the opening or openings in the insulating film 40u and/or the insulating film 40d.

On the joint surface Sd side of the second substrate 100d, the insulating layer 10d has a substantially flat surface, the electrode 20d is one step recessed as compared to the insulating layer 10d constituting the surrounding structure, and a recess D is provided in the part of the electrode 20d. The joint surface Sd of the second substrate 100d is covered with an insulating film 40d laminated in a thin film form in a substantially uniform thickness along the joint surface Sd, and the insulating film 40d is formed integrally inclusive of its portion covering a recessed shape of the electrode 20d. In other words, the insulating film 40d on the joint surface Sd side also has a recessed shape at the part of the electrode 20d.

The insulating film 40d has an opening 41d in at least part of its portion covering the electrode 20d. As illustrated in FIGS. 5A, 5B, 5C, 5D, 5E, and 5F, the opening 41d may be formed in a partial area of the insulating film 40d covering the electrode 20d, may be formed dispersedly in a plurality of locations of the insulating film 40d covering the electrode 20d, or may be formed in substantially the whole area of the insulating film 40d covering the electrode 20d.

An area between the first substrate 100u and the second substrate 200d joined to each other with the corresponding electrodes 20u and 20d aligned to face each other is a chamber C surrounded by the recessed shape of the insulating film 40u and the recessed shape of the insulating film 40d. Into the chamber C, swelling portions 21u and 21d formed by swelling of electrode materials of the electrodes 20u and 20d through the openings 41u and 41d are projecting, and the swelling portions 21u and 21d are joined to each other to electrically connect the electrodes 20u and 20d with each other.

FIGS. 4A, 4B, 4C, 4D, and 4E are figures for explaining an example of a method of manufacturing the semiconductor device 100 according to the present embodiment. Note that herein with respect to manufacturing steps which are common for the first substrate 100u and the second substrate 100d, reference signs with an "x" in place of "u" or "d" will be used in description.

Figure 4A:
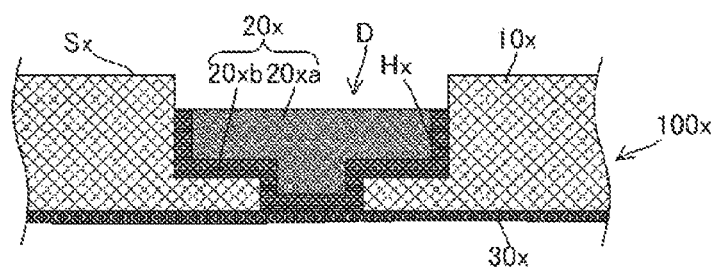
FIGS. 4A, 4B, 4C, 4D, and 4E are figures for explaining a method of manufacturing a semiconductor device according to the first embodiment.
Figure 4B:
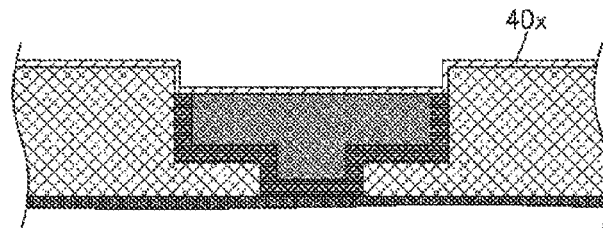

First, an insulating layer 10x is laminated on a joint surface Sx side of a substrate 100x, a through-hole Hx penetrating the insulating layer 10x to a wiring 30x is formed, a barrier metal film 20xa is formed in the through-hole Hx, and an area thereover is filled with an electrode material or formed with a film of the electrode material to form a conductive section 20xb, thereby forming an electrode 20x penetrating the insulating layer 10x (first step). Thereafter, a material of a barrier metal film laminated on a surface of the insulating layer 10x outside the through-hole Hx and the electrode material are removed by being polished or ground away by chemical mechanical polishing technique (second step). In this instance, depending on the selection of an abrasive or a polishing cloth, the electrode 20x is over-polished as compared to the insulating layer 10x and a recess D generally called dishing is formed (FIG. 4A).

Next, a thin film of the insulating film 40x is formed on the insulating layer 10x and the recess D of the electrode 20x (third step). The insulating film 40x is formed from any of SiCN, SiC and SiO$_2$ or a combination thereof. The insulating film 40x can be formed by, for example, an ALD (Atomic Layer deposition) method.

Figure 4C:
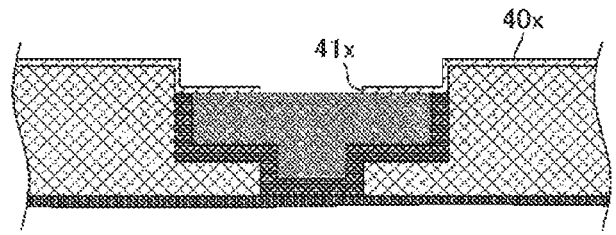

Subsequently, an opening 41x is formed in the insulating film 40x formed on the electrode 20x (fourth step). The opening 41x is formed by forming a resist in areas other than the opening 41x by lithography technique, removing the opening 41x part by etching, and thereafter removing the resist (FIG. 4C).

Figure 4D:
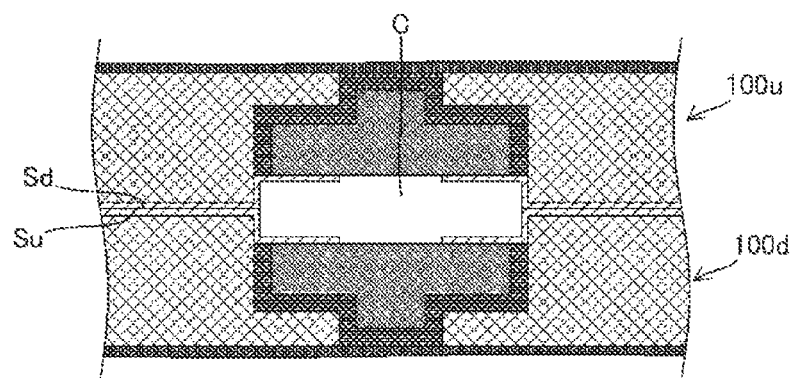
Figure 4E:
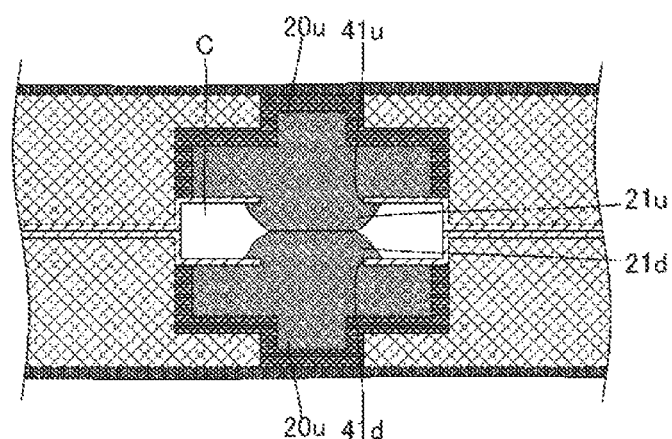
Figure 5A:
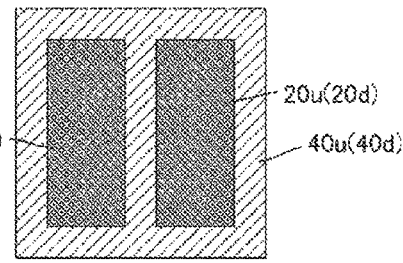
FIGS. 5A, 5B, 5C, 5D, 5E, and 5F are figures depicting another shape of the electrode joint section of the semiconductor device according to the first embodiment.
Figure 5D:
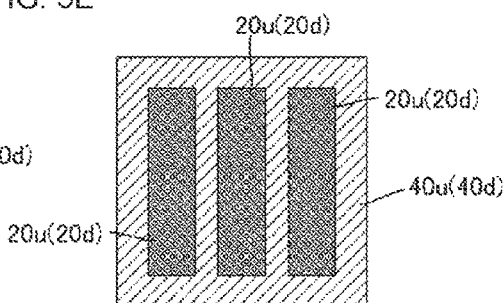
Figure 5B:
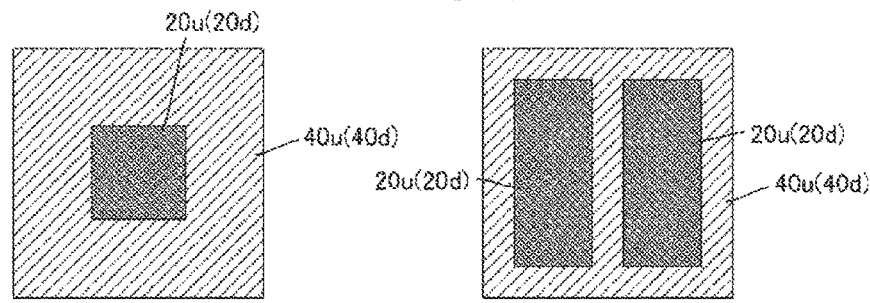
Figure 5E:
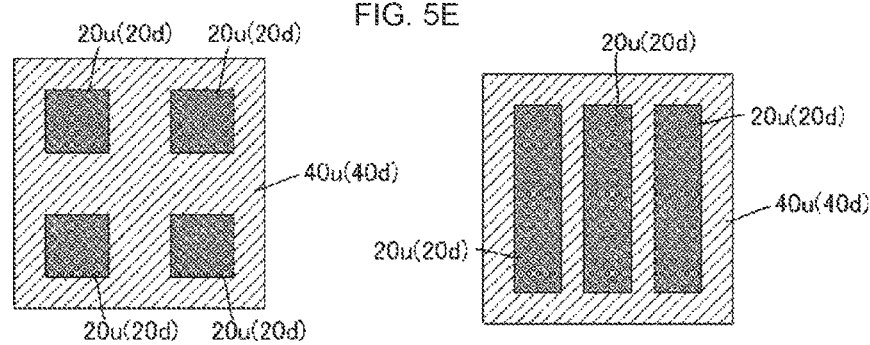
Figure 5C:
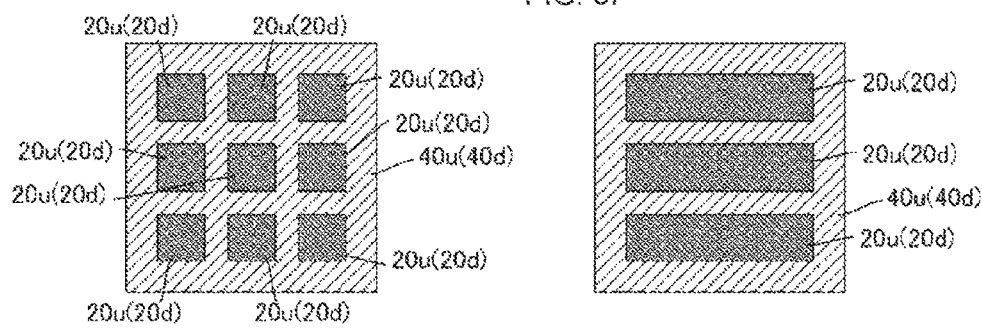
Figure 5F:
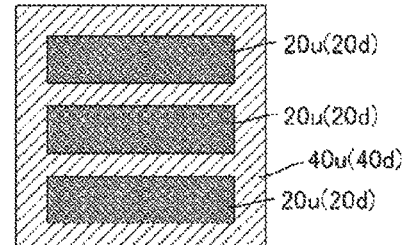

Next, the joint surfaces Su and Sd of the first substrate 100u and the second substrate 100d are made to face each other, and the substrates are joined to each other by bonding while aligning the corresponding electrodes 20u and 20d to face each other (FIG. 4D, fifth step). As a result, the chamber C is formed between the electrodes 20u and 20d.

Subsequently, the first substrate 100u and the second substrate 100d joined to each other are heat treated such that the electrodes 20u and 20d are thermally expanded and the respective electrode materials are swelled to project through the openings 41u and 41d into the chamber C, to form the swelling portions 21u and 21d, and the swelling portions 21u and 21d are joined to each other within the chamber C such that electrical contact is securely formed between the electrodes 20u and 20d (sixth step). By the above-mentioned steps, the electrode joint section of the semiconductor device 100 according to the present embodiment can be produced.

(B) Second Embodiment

Figure 6:
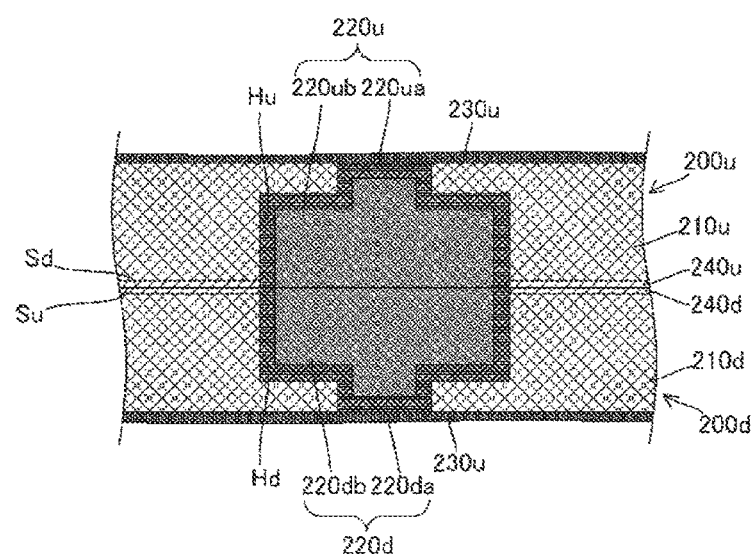
FIG. 6 is a figure sectionally depicting an electrode joint section of a semiconductor device according to a second embodiment.

FIG. 6 is a figure sectionally depicting, in an enlarged form, an electrode joint section of a semiconductor device 200 according to the present embodiment. Note that general structure of the semiconductor device 200 is the same as that of the semiconductor device 100 described above with reference to FIGS. 1 and 2, and, therefore, description will be omitted.

An electrode 220u includes a barrier metal film 220ua formed in a film shape such as to cover the inside of a through-hole Hu penetrating an insulating layer 210$u$ in the thickness direction, and a conductive section 220$ub$ formed by forming a film of an electrode material on the inside of the barrier metal film 220$ua$ or filling the inside with the electrode material. Similarly, an electrode 220$d$ includes a barrier metal film 220$da$ formed in a film shape such as to cover the inside of a through-hole Hd penetrating an insulating layer 210$d$ in the thickness direction, and a conductive section 220$db$ formed by forming a film of an electrode material on the inside of the barrier metal film 220$da$ or filling the inside with the electrode material.

On the joint surface Su side of the first substrate 200$u$, the insulating layer 210$u$ has a substantially flat surface, and is covered with an insulating film 240$u$ laminated in a thin film form in a substantially uniform thickness along the joint surface Su. Similarly, on the joint surface Sd side of the second substrate 200$d$, the insulating layer 210$d$ has a substantially flat surface, and is covered with an insulating film 240$d$ laminated in a thin film form in a substantially uniform thickness along the joint surface Sd. In other words, two layers of insulating films including the insulating film 240$u$ and the insulating film 240$d$ are interposed between the insulating layer 210$u$ of the first substrate 200$u$ and the insulating layer 210$d$ of the second substrate 200$d$.

The electrode 220$u$ and the electrode 220$d$ have their facing surfaces in direct contact with each other. In other words, the insulating films 240$u$ and 240$d$ are not interposed between the facing portions of the surfaces of the electrode 220$u$ and the electrode 220$d$.

By the insulating film 240$u$ and the barrier metal film 220$ua$, a structure partitioning between the conductive section 220$ub$ and the insulating layer 210$u$ in a substantially cross-sectional hat shape is formed. Similarly, by the insulating film 240$d$ and the barrier metal film 220$da$, a structure partitioning between the conductive section 220$db$ and the insulating layer 210$d$ in a substantially cross-sectional hat shape is formed.

The structure formed by the insulating film 240$u$ and the barrier metal film 220$ua$ to partition between the conductive section 220$ub$ and the insulating layer 210$u$ in a substantially cross-sectional hat shape and the structure formed by the insulating film 240$d$ and the barrier metal film 220$da$ to partition between the conductive section 220$db$ and the insulating layer 210$d$ in a substantially cross-sectional hat shape are formed in a close contact state, with the hat recess portions facing each other. For this reason, even in the case where the first substrate 200$u$ and the second substrate 200$d$ are joined to each other by bonding in a state where the electrode 220$u$ and the electrode 220$d$ are positionally deviated from each other, there is no possibility for the conductive section 220$ub$ to come into contact with the insulating layer 210$d$ or for the conductive section 220$db$ to come into contact with the insulating layer 210$u$.

FIGS. 7A, 7B, 7C, 7D, 7E, and 7F are figures for explaining an example of a method of manufacturing the semiconductor device 200 according to the present embodiment. Note that hereinafter with respect to the manufacturing steps which are common for the first substrate 200$u$ and the second substrate 200$d$, reference signs with an "x" in place of "u" or "d" will be used in description.

Figure 7A:
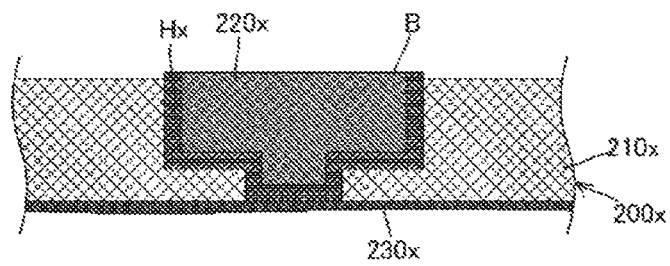
FIGS. 7A, 7B, 7C, 7D, 7E, and 7F are figures for explaining a method of manufacturing the semiconductor device according to the second embodiment.
Figure 7B:
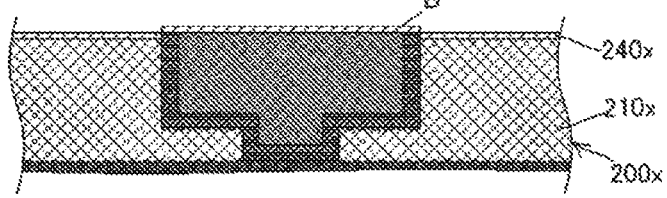

First, an insulating layer 210$x$ is laminated on a joint surface S side of the substrate 200$x$, a through-hole Hx penetrating the insulating layer 210$x$ to a wiring 230$x$ is formed, a barrier metal film 220$xa$ is formed in the through-hole Hx, and an area thereover is filled with an electrode material or formed with a film of the electrode material to form a conductive section 220$xb$, thereby forming an electrode 220$x$ penetrating the insulating layer 210$x$ (seventh step). Thereafter, a material of a barrier metal film laminated on a surface of the insulating layer 210$x$ outside the through-hole Hx and the electrode material are removed by being polished or grounded away by chemical mechanical polishing technique. In this instance, depending on the selection of the abrasive and polishing cloth, the degree of polishing of the electrode 220$x$ is lowered as compared to that of the insulating layer 210$x$ and a projection B is formed (FIG. 7A, eighth step).

Next, a thin film of an insulating film 240$x$ is formed on the insulating layer 210$x$ and the projection B of the electrode 220$x$ (ninth step). The insulating film 240$x$ is formed from any of SiCN, SiC and SiO$_2$ or a combination thereof. The thickness of the insulating film 240$x$ is on the order of the projection amount of the projection B (the amount corresponding to a step between the projection B and the insulating layer 210$x$). The insulating layer 240$x$ can be formed by, for example, an ALD (Atomic Layer deposition) method.

Figure 7C:
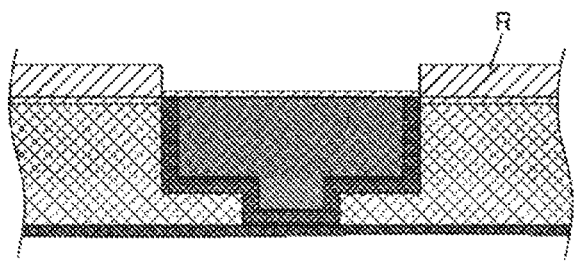
Figure 7D:
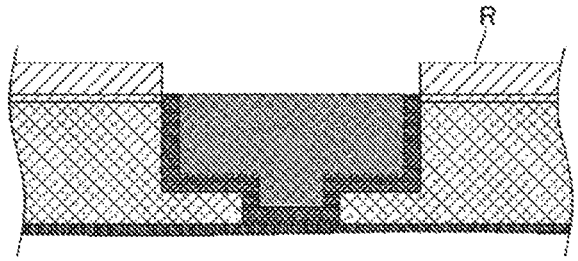
Figure 7E:
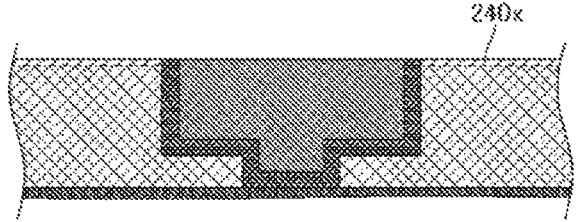

Subsequently, the insulating film 240$x$ formed on the electrode 220$x$ is removed (tenth step). The removal of the insulating film 240$x$ is performed by forming a resist R in an area other than the electrode 220$x$ by lithography technique, removing the insulating film 240$x$ on the electrode 220$x$ by etching, and thereafter removing the resist R (FIGS. 7C, 7D, and 7E).

Figure 7F:
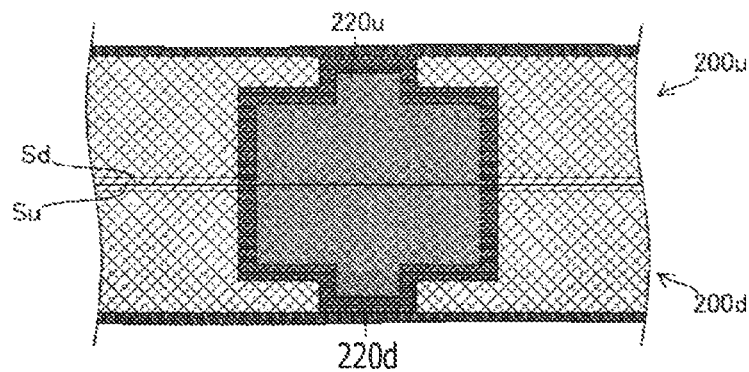

Next, the joint surfaces Su and Sd of the first substrate 200$u$ and the second substrate 200$d$ are made to face each other, and the substrates are joined to each other by bonding while aligning the corresponding electrodes 220$u$ and 220$d$ to face each other (FIG. 7F, eleventh step). Then, the first substrate 200$u$ and the second substrate 200$d$ joined to each other are heat treated and the electrodes 220$u$ and 220$d$ are electrically connected with each other securely. By the above-mentioned steps, the electrode joint section of the semiconductor device 200 according to the present embodiment can be produced.

(C) Third Embodiment

Figure 8:
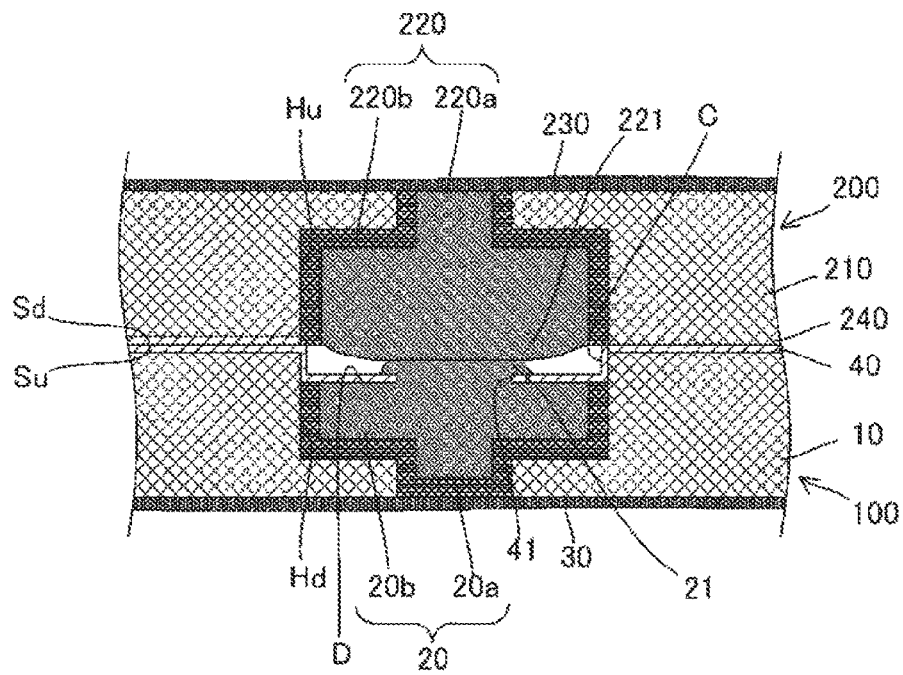
FIG. 8 is a figure sectionally depicting an electrode joint section of a semiconductor device according to a third embodiment.

FIG. 8 is a figure sectionally depicting, in an enlarged form, an electrode joint section of a semiconductor device 300 according to the present embodiment. Note that a general structure of the semiconductor device 300 is the same as that of the semiconductor device 100 described above with reference to FIGS. 1 and 2, and, therefore, description will be omitted. In addition, since the semiconductor device 300 has a structure in which one of the substrates of the semiconductor device 100 and one of the substrates of the semiconductor device 200 are joined to each other, parts are denoted by the reference signs used in the above-mentioned embodiments, and detailed descriptions will be omitted.

The semiconductor device 300 according to the present embodiment has a structure in which a substrate on one side of the substrates to be joined to each other by bonding has a recess D, and a substrate on the other side has a projection B. The substrate having the recess D is produced by a producing method the same as or similar to that in the first embodiment, and the substrate having the projection B is produced by a producing method the same as or similar to that in the second embodiment. When these substrates are bonded to each other, a chamber C which is substantially half of that in the first embodiment is formed on the recess D side.

Thereafter, a heat treatment is conducted such that the electrodes 20 and 220 are thermally expanded, the electrode 20 expands and projects via the opening 41, whereas the electrode 220 expands and projects as a whole, to form swelling portions 21 and 221, and these swelling portions 21 and 221 are joined to each other within the chamber C such that electrical contact is securely formed between the electrodes 20$u$ and 20$d$. By the above-mentioned steps, the electrode joint section of the semiconductor device 300 according to the present embodiment can be produced.

(D) Fourth Embodiment

Figure 9:
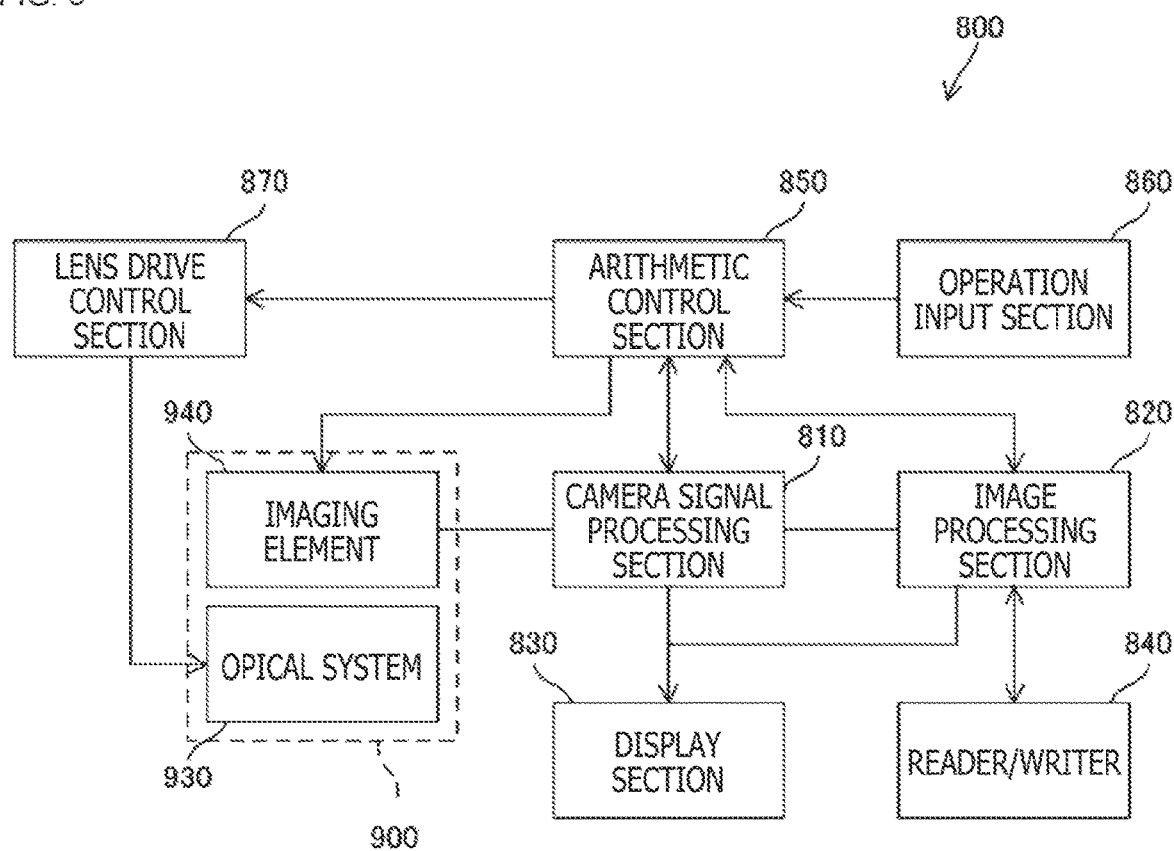
FIG. 9 is a block diagram depicting a schematic configuration of an example of an imaging device.

FIG. 9 is a block diagram depicting a schematic configuration of an example of an imaging apparatus 800 as an example of an electronic apparatus on which the semiconductor device according to the above embodiments is mounted. The imaging apparatus 800 is a digital still camera, a digital video camera, a mobile phone equipped with a camera, or the like.

The imaging apparatus 800 includes a module 900, a camera signal processing section 810, an image processing section 820, a display section 830, a reader/writer 840, an arithmetic processing section 850, an operation input section 860, and a lens drive control section 870.

The module 900 is a component in charge of performing an imaging function, and includes an optical system 930 including a lens 911 as an imaging lens, and an imaging element 940 such as CCD (Charge Coupled Devices) and CMOS (Complementary Metal Oxide Semiconductor). This imaging element 940 corresponds to the solid-state imaging element according to the above embodiments. The imaging element 940 converts an optical image formed by the optical system 930 into an electrical signal, and outputs an imaging signal (image signal) according to the optical image.

The camera signal processing section 810 applies various kinds of signal processing such as analog-to-digital conversion, noise removal, image quality correction, and conversion to luminance and color difference signals to the image signal outputted by the imaging element 940.

The image processing section 820 performs recording and reproduction processing of the image signal, and performs compression encoding and expansion decoding processing of the image signal based on a predetermined image data format, conversion processing of data specification such as resolution, and so on.

The display section 830 has a function of displaying a display according to operation inputs to the operation input section 860 and various kinds of data such as a picked-up image.

The reader/writer 840 performs writing of data onto an external storage medium such as a memory card and reading of data from the external storage medium; for example, the reader/writer 840 writes image data obtained through encoding by the image processing section 820 onto an external storage medium, and reads image data stored in an external storage medium and outputs the image data to the image processing section 820.

The arithmetic processing section 850 is a component that functions as a control section controlling each circuit block of the imaging apparatus 800, and controls each circuit block based on, for example, operation input signals from the operation input section 860. Based on a control signal from the arithmetic processing section 850, a driving driver of the module 900 controls, for example, a drive motor for driving a lens circle.

The operation input section 860 includes switches or a touch panel or the like for a user to perform a required operation therewith; for example, it includes such elements as a shutter release operation element for performing a shutter operation or a selection operation element for selecting an operation mode, and outputs an operation input signal to the arithmetic processing section 850 according to the operation inputs by the user.

(E) Example of Application to Endoscopic Surgery System

The technology according to the present disclosure (present technology) is applicable to various products. For example, the technology according to the present disclosure may be applied to an endoscopic surgery system.

Figure 10:
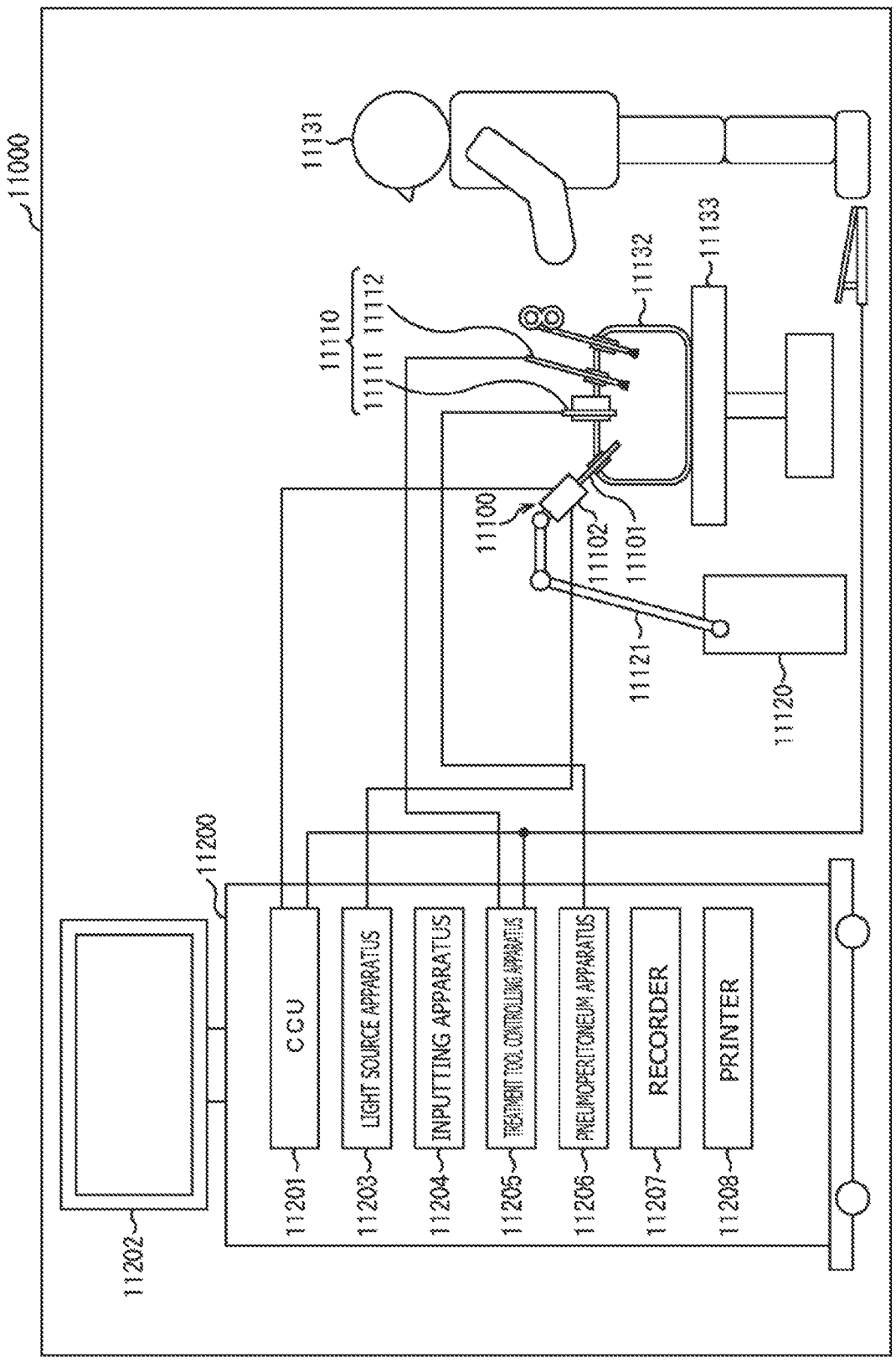
FIG. 10 is a figure depicting an example of a schematic configuration of an endoscopic surgery system.

FIG. 10 is a view depicting an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 11:
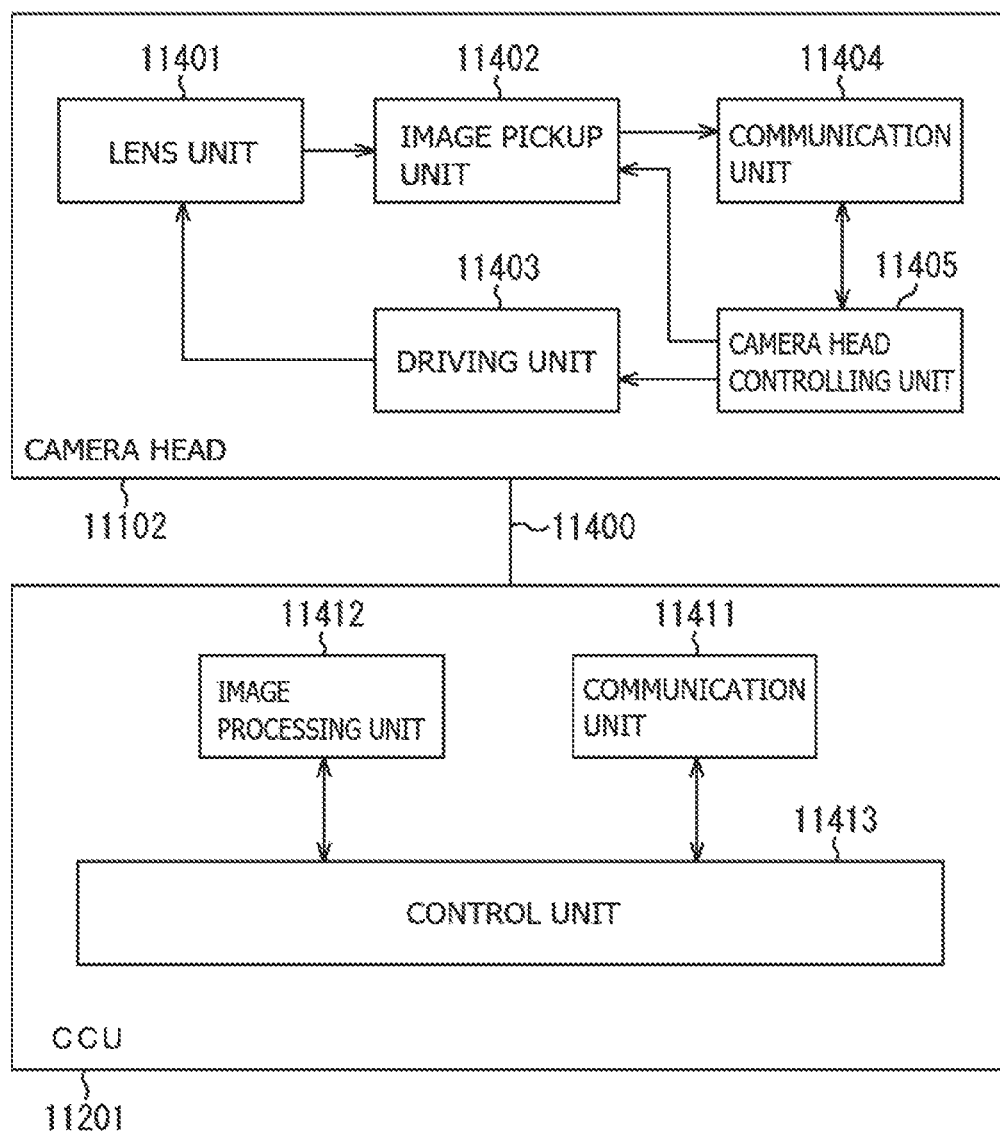
FIG. 11 is a block diagram depicting an example of a functional configuration of a camera head and a CCU.

FIG. 11 is a block diagram depicting an example of a functional configuration of the camera head 11102 and the CCU 11201 depicted in FIG. 10.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described above. The technology according to the present disclosure is applicable, for example, to the endoscope 11100, the camera head 11102 (the image pickup unit 11402 thereof), the CCU 11201 (the image processing unit 11412 thereof) and the like, among the above-described configurations.

Note that the endoscopic surgery system has been described as an example here and the technology according to the present disclosure may be applied to other systems, such as a microscopic surgery system, for example.

(F) Example of Application to Moving Body

The technology according to the present disclosure (present technology) is applicable to various products. For example, the technology according to the present disclosure may be realized as a device to be mounted on any type of moving body such as an automobile, electric vehicle, hybrid electric vehicle, motorcycle, bicycle, personal mobility, airplane, drone, ship, and robot.

Figure 12:
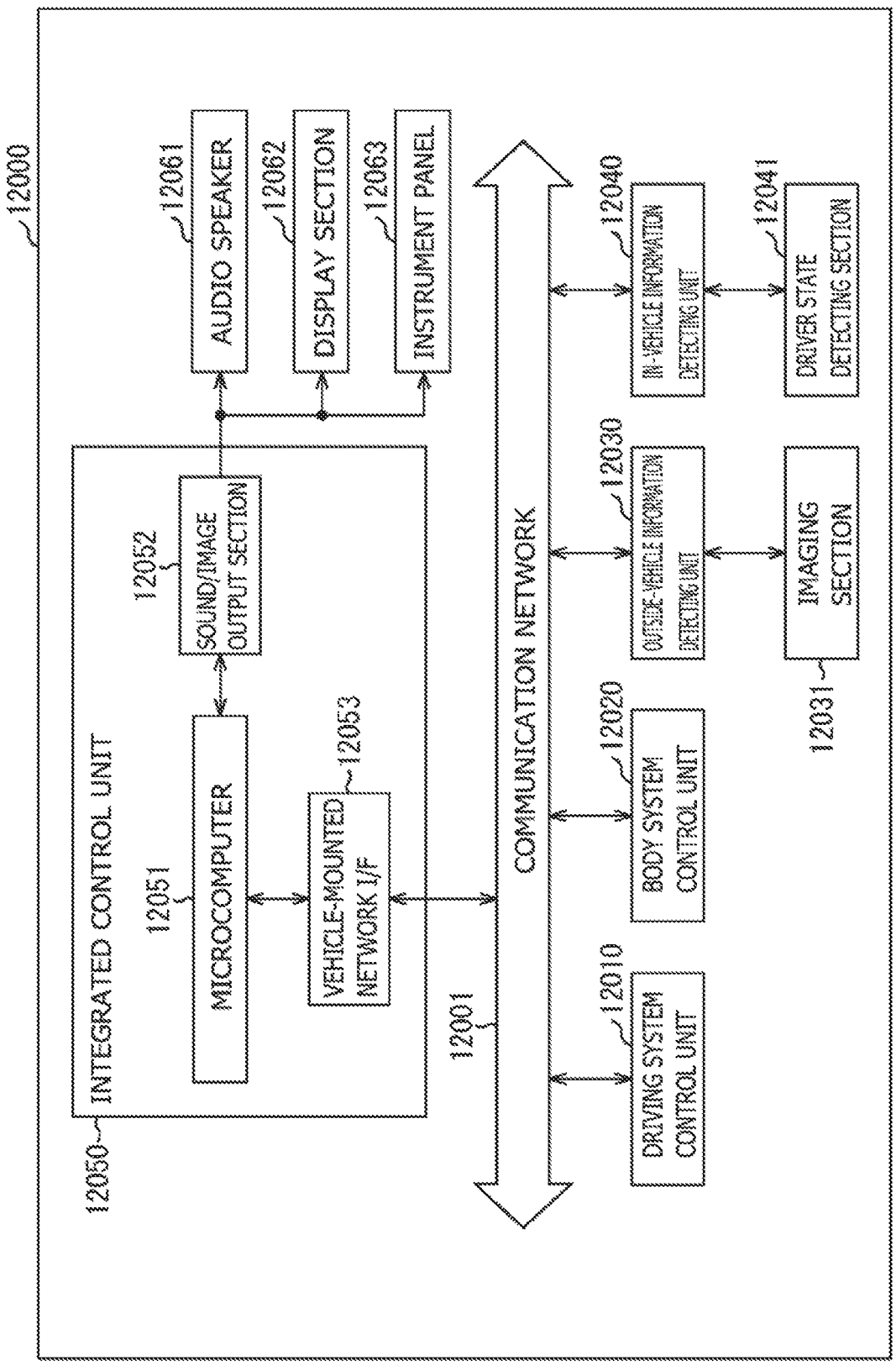
FIG. 12 is a block diagram depicting an example of schematic configuration of a vehicle control system.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

Figure 13:
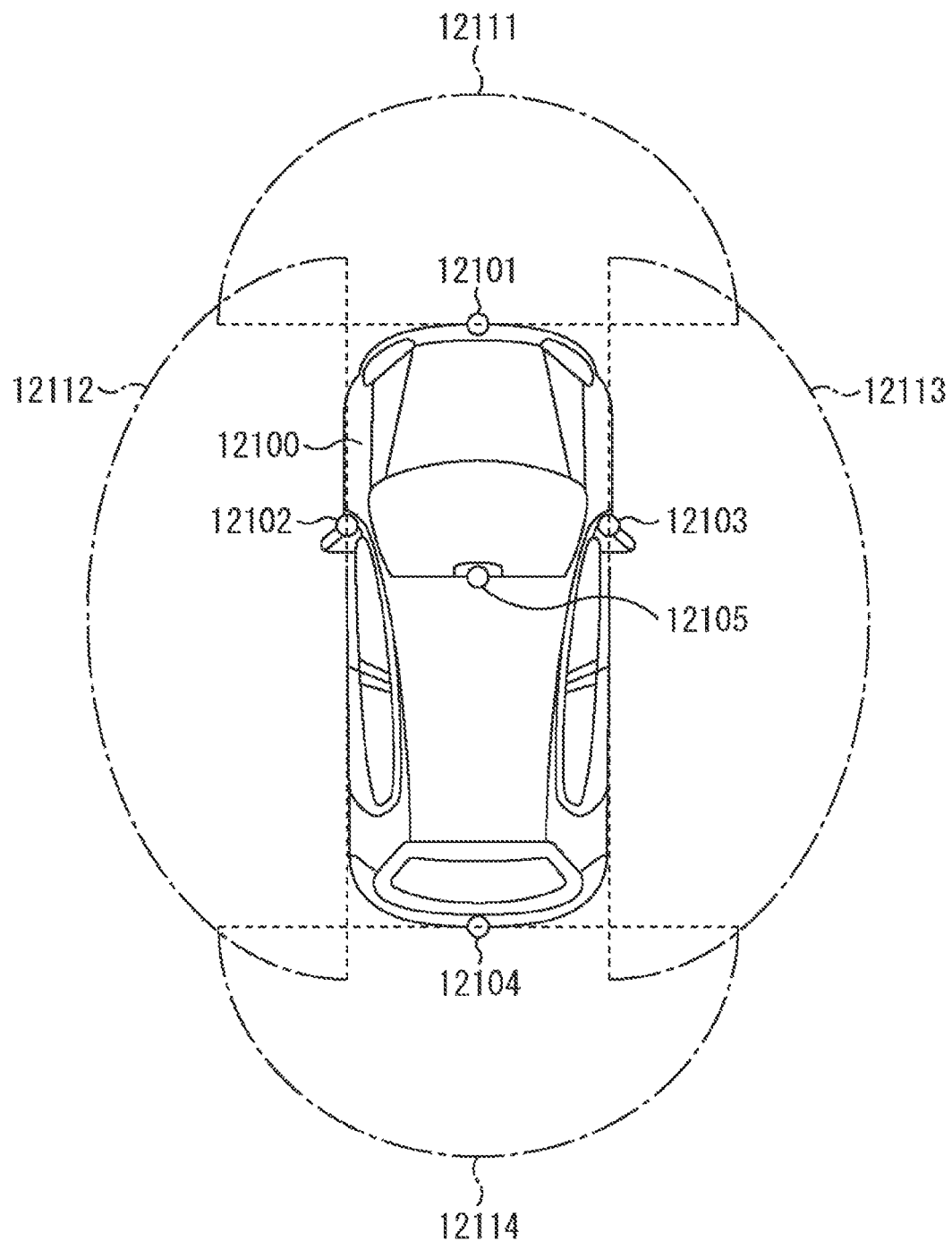
FIG. 13 is a diagram depicting an example of the installation position of an outside-vehicle information detecting unit and an imaging section.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display. FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described hereinabove. The technology according to the present disclosure is applicable, for example, to the imaging section 12031, among the above-described configurations.

Note that the present technology is not limited to the aforementioned embodiments and includes configurations obtained by mutually replacing or modifying the combination of the configurations disclosed in the above embodiments, configurations obtained by mutually replacing or modifying the combination of the configurations disclosed in the publicly known art and the above embodiments, and so on. In addition, the technical scope of the present technology is not limited to the above embodiments and includes the matters described in the claims and equivalents thereof.

Besides, the present technology can take the following configurations.

(1)
A method of manufacturing a semiconductor device, the method including:
  a first step of embedding electrodes in insulating layers exposed to joint surfaces of a first substrate and a second substrate;
  a second step of subjecting the joint surfaces of the first substrate and the second substrate to chemical mechanical polishing, to form the electrodes into recesses recessed as compared to the insulating layers;
  a third step of laminating insulating films of a uniform thickness over the entire joint surfaces;
  a fourth step of forming an opening by etching in at least part of the insulating films covering the electrodes of the first substrate and the second substrate;
  a fifth step of causing the corresponding electrodes to face each other and joining the joint surfaces of the first substrate and the second substrate to each other; and
  a sixth step of heating the first substrate and the second substrate joined to each other, causing the electrode material to expand and project through the opening, and joining the corresponding electrodes to each other.

(2)
The method of manufacturing the semiconductor device according to (1) above, in which
  in the fourth step, the openings are formed in a plurality of locations of the insulating film covering the electrode.

(3)
The method of manufacturing the semiconductor device according to (1) above, in which
  in the fourth step, the openings are formed in substantially the entire insulating film covering the electrode.

(4)
The method of manufacturing the semiconductor device according to (1) above, in which
  in the fourth step, the openings are formed in substantially the entire insulating film covering the electrode of the first substrate, and the opening is formed in a partial area of the insulating film covering the electrode of the second substrate.

(5)
A method of manufacturing a semiconductor device, the method including:
  a seventh step of embedding electrodes in insulating layers exposed to joint surfaces of a first substrate and a second substrate;
  an eighth step of subjecting the joint surfaces of the first substrate and the second substrate to chemical mechanical polishing to form the electrodes into projections projecting from the insulating layers;
  a ninth step of laminating on the joint surface an insulating film in substantially the same thickness as the projection;
  a tenth step of completely removing by etching the insulating films covering the electrodes; and
  an eleventh step of causing the corresponding electrodes to face each other and joining the joint surfaces of the first substrate and the second substrate to each other.

(6)
A semiconductor device including:
  a first substrate;
  a second substrate to be joined to the first substrate;
  electrodes embedded at facing positions in joint surfaces of the first substrate and the second substrate, with an electrode surface of at least one of the first substrate and the second substrate being formed in a recess more recessed as compared to a surrounding insulating layer; and insulating films laminated in a uniform thickness along the joint surfaces of the first substrate and the second substrate, and having openings in at least part of portions covering the electrodes, in which an electrode material swelling via at least one of the openings is joined to an electrode material on the other side.

REFERENCE SIGNS LIST 10x, 10d, 10u Insulating layer, 20x, 20d, 20u Electrode, 20a, 20d, 20ua Barrier metal film, 20b, 20db, 20ub section, 21x, 21d, 21u Swelling portion, 30x, 30d, 30u Wiring, 40x, 40d, 40u Insulating film, 41x, 41d, 41u Opening, 100 Semiconductor device, 100d Second substrate, 100u First substrate, 200 Semiconductor device, 200x Substrate, 200d Second substrate, 200u First substrate, 210x, 210d, 210u Insulating layer, 220x, 220d, 220u Electrode, 220a, 220da, 220ua Barrier metal film, 220b, 220db, 220ub Conductive section, 221 Swelling portion, 230 Wiring, 240x, 240d, 240u Insulating film, 300 Semiconductor device, B Projection, C Chamber, D Recess, H, Hd, Hu Through-hole, S, Sd, Su Joint surface

The invention claimed is:

1. A semiconductor device, comprising:
a first substrate;
a second substrate;
a first insulating layer in the first substrate;
a second insulating layer in the second substrate, wherein a first portion of the first insulating layer is in contact with a first portion of the second insulating layer;
a first metal portion including a first surface on a side of the first metal portion and a second surface on the side of the first metal portion; and
a second metal portion including a first surface on a side of the second metal portion, wherein
the first surface of the first metal portion is in contact with the first surface of the second metal portion at a bonding surface of the first portion of the first insulating layer and the first portion of the second insulating layer, and
the first surface of the first metal portion is closer to the second substrate than the second surface of the first metal portion.

2. The semiconductor device according to claim 1, further comprising:
a first barrier metal film; and
a second barrier metal film.

3. The semiconductor device according to claim 1, wherein
the first insulating layer includes a first insulting film and a second insulating film,
the first portion of the first insulating layer includes a first portion of the first insulating film, and
a second portion of the first insulating layer includes a second portion of the first insulating film and a first portion of the second insulating film.

4. The semiconductor device according to claim 3, wherein
the first insulating film is on a joint surface of the first substrate,
the second insulating film is on a joint surface of the second substrate, and
the joint surface of the first substrate is in contact with the joint surface of the second substrate.

5. The semiconductor device according to claim 3, wherein
the second insulating layer includes a third insulating film and a fourth insulating film,
the first portion of the second insulating layer includes a first portion of the third insulating film, and
a second portion of the second insulating layer includes a second portion of the third insulating film and a first portion of the fourth insulating film.

6. The semiconductor device according to claim 1, wherein
the first insulating layer includes a first opening, and an area of the first insulating layer includes a first electrode.

7. The semiconductor device according to claim 1, wherein
the second insulating layer includes a second opening, and
an area of the second insulating layer includes a second electrode.

8. The semiconductor device according to claim 1, wherein the second surface of the first metal portion is covered by a thin insulating film.

9. The semiconductor device according to claim 1, wherein the second surface of the first metal portion is between the first surface of the first metal portion and a third surface of the first metal portion.

10. The semiconductor device according to claim 1, wherein
the second metal portion further includes a second surface on a side of the second metal portion, and
the second surface of the second metal portion is closer to the second substrate than the first surface of the second metal portion.

11. A semiconductor device, comprising:
a first substrate;
a second substrate;
a first insulating layer on the first substrate;
a second insulating layer on the second substrate, wherein a first portion of the first insulating layer is in contact with a first portion of the second insulating layer;
a first metal portion including:
a first surface in a first side of the first metal portion,
a second surface in the first side of the first metal portion,
a third surface on a second side of the first metal portion, wherein the second side is opposite to the first side of the first metal portion, and
a fourth surface between the second surface and the third surface;
a second metal portion including a first surface on a side of the second metal portion, wherein the first surface of the first metal portion is in contact with the first surface of the second metal portion; and
a metal layer on the first insulating layer, wherein
the second surface of the first metal portion is closer to the first substrate than the first surface of the first metal portion, and
the third surface of the first metal portion is directly in contact with the metal layer.

* * * * *